(12) United States Patent
Osumi

(10) Patent No.: US 8,952,417 B2
(45) Date of Patent: Feb. 10, 2015

(54) LIGHT EMITTING DEVICE

(71) Applicant: Nichia Corporation, Anan-shi, Tokushima (JP)

(72) Inventor: Tomokazu Osumi, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 14/103,460

(22) Filed: Dec. 11, 2013

(65) Prior Publication Data
US 2014/0091356 A1 Apr. 3, 2014

Related U.S. Application Data

(63) Continuation of application No. 13/559,075, filed on Jul. 26, 2012, now Pat. No. 8,637,896.

(30) Foreign Application Priority Data

Jul. 29, 2011 (JP) .................................. 2011-167663

(51) Int. Cl.
H01L 33/48 (2010.01)
H01L 33/62 (2010.01)

(52) U.S. Cl.
CPC ............. *H01L 33/62* (2013.01); *H01L 33/486* (2013.01); *H01L 2933/0033* (2013.01); *H01L 2924/0002* (2013.01)
USPC ..................................... 257/99; 257/E33.058

(58) Field of Classification Search
USPC .............. 257/89, 99, 100, E33.055–E33.059; 362/362; D13/180
See application file for complete search history.

(56) References Cited

U.S. PATENT DOCUMENTS

| 6,812,481 | B2 | 11/2004 | Matsumura et al. |
| D609,654 | S * | 2/2010 | Hsieh ............................ D13/180 |
| 2008/0230790 | A1 | 9/2008 | Seko et al. |
| 2011/0175127 | A1 * | 7/2011 | Kanada et al. ................... 257/98 |
| 2013/0026532 | A1 * | 1/2013 | Osumi ............................ 257/99 |

FOREIGN PATENT DOCUMENTS

| JP | 2003-077317 A | 3/2003 |
| JP | 2010-034295 A | 2/2010 |

* cited by examiner

*Primary Examiner* — Cheung Lee
*Assistant Examiner* — Stephen Bradley
(74) *Attorney, Agent, or Firm* — Global IP Counselors, LLP

(57) ABSTRACT

A light emitting device includes a package constituted by a molded article having a light emitting face, a bottom face, and a rear face, and a pair of leads partially embedded in the molded article, protrude from the bottom face, and have ends that bend toward either the light emitting face or the rear face. The molded article has a front protruding part that protrudes from the bottom face and includes a surface continuous with the light emitting face, the front protruding part being spaced apart from the rear face, and a rear protruding part that protrudes from the bottom face and includes a surface continuous with the rear face, the rear protruding part being spaced apart from the light emitting face, between the leads on the bottom face, the front protruding part being spaced apart from the rear protruding part.

13 Claims, 11 Drawing Sheets

LIGHT EMITTING DEVICE

CROSS-REFERENCE TO RELATED APPLICATIONS

This application is a continuation application of U.S. patent application Ser. No. 13/559,075 filed on Jul. 26, 2012. This application claims priority to Japanese Application No. 2011-167663 filed in Japan on Jul. 29, 2011. The entire disclosures of U.S. patent application Ser. No. 13/559,075 and Japanese Application No. 2010-167663 are incorporated hereinto by reference.

BACKGROUND

1. Technical Field

The present invention relates to a light emitting device.

2. Related Art

There are conventional light emitting devices with which the width of the light emitting component (cavity) of the light emitting device is increased as much as possible with respect to the width of the light emitting device by taking out the terminals from directly under the light emitting component, in order to mount a plurality of side-mount light emitting devices more densely on a circuit board.

However, with a light emitting device such as this, the package becomes taller, so mounting is unstable because of the high center of gravity.

In view of this, a method has been proposed, for example, for improving mounting stability by providing a terminal that is bent forward and another terminal that is bent backward, to balance out the surface tension of the solder at the front and back of the light emitting device (Patent Literature 1: JP2003-77317-A, etc.).

When terminals are bent forward and backward as with the light emitting device discussed above, a problem is that the bending step adds complexity, and this adversely affects productivity.

Also, in order to bend the terminals forward and backward, the light emitting device needs to be thick enough to allow both terminals to be disposed in the depth direction, and this is also a problem in that the light emitting device cannot be made as compact.

The present invention was conceived in light of the above problems, and it is an object thereof to provide a light emitting device that has high mounting stability, even with a compact light emitting device, without any decrease in productivity.

SUMMARY

A light emitting device includes a package constituted by a molded article having a light emitting face, a bottom face that is contiguous with the light emitting face, and a rear face that is on the opposite side from the light emitting face, and a pair of leads that are partially embedded in the molded article, protrude from the bottom face, and have ends that bend toward either the light emitting face or the rear face, and a light emitting element that is disposed on one of the pair of leads. The molded article has a front protruding part that protrudes from the bottom face and includes a surface that is continuous with the light emitting face, the front protruding part being spaced apart from the rear face, and a rear protruding part that protrudes from the bottom face and includes a surface that is continuous with the rear face, the rear protruding part being spaced apart from the light emitting face, between the leads on the bottom face, the front protruding part being spaced apart from the rear protruding part.

With the present invention, it is possible to provide a light emitting device that has high mounting stability, even with a compact light emitting device, without any decrease in productivity.

DETAILED DESCRIPTION OF EXEMPLARY EMBODIMENTS

Figure 1A:
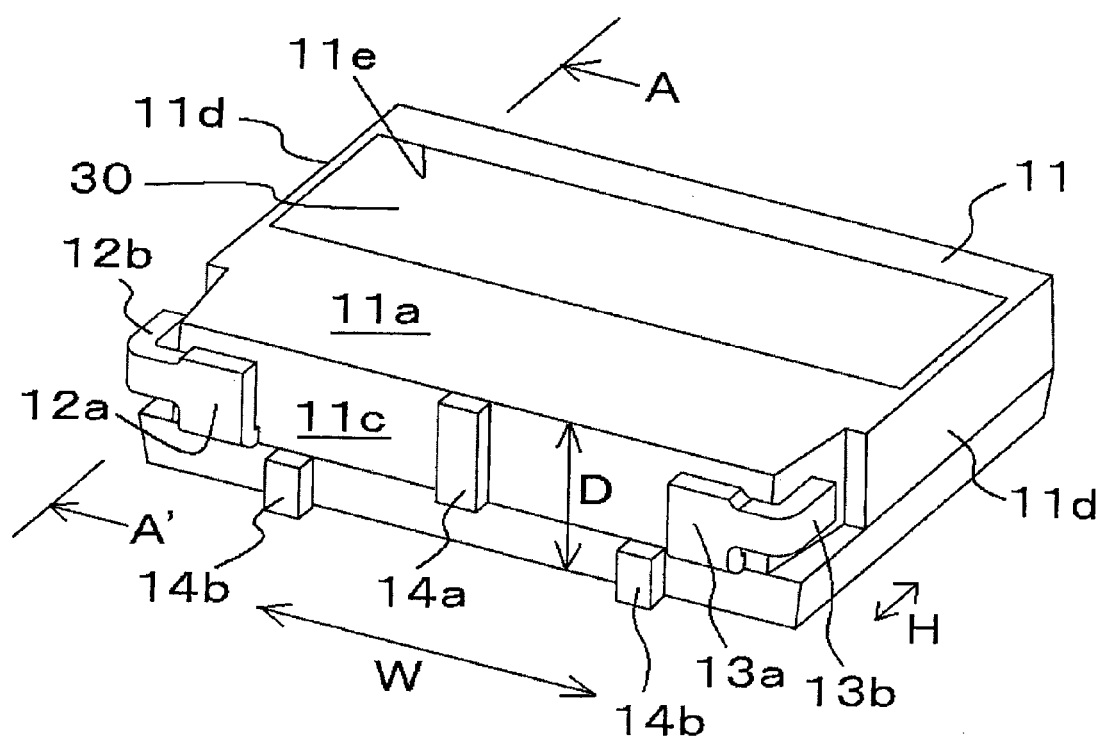
FIG. 1A is a top oblique view of the light emitting device in Embodiment 1 of the present invention.

An embodiment of the present invention will now be described through reference to the drawings. In the following description of the drawings, portions that are the same or similar will be given the same or similar numbers. The drawings are merely schematic illustrations, and the proportions and so forth of the various dimensions may differ from those of the actual dimensions.

Embodiment 1

As shown in FIGS. 1A to 1E, the light emitting device in this embodiment mainly comprises a package and a light emitting element 20.

This light emitting device is what is called a side view type. A side-view light emitting device is a type in which the light emitted from the light emitting element is taken out in a direction parallel to a mounting face of a mounting board. These side-view light emitting devices are generally small in the depth direction, and one of their characteristics is they are more prone to toppling forward or backward than what is known as a top-view light emitting device.

Package

The package has a molded article 11 composed of a resin, and a pair of leads 12 and 13 that are partially embedded in the molded article 11.

Molded Article 11

The molded article 11 is usually formed in a substantially cuboid shape, and defines the external shape of the package. The shape of the molded article 11 is not limited to being cuboid, however, and may instead be that of a polyhedral prism, a polyhedral cone, or some other such shape. This package usually has a light emitting face 11a, a bottom face 11c that is contiguous with this light emitting face 11a, and a rear face 11b on the opposite side from the light emitting face 11a. It is also preferable for there to be side faces 11d that are contiguous with the light emitting face 11a, the bottom face 11c, and the rear face 11b.

The light emitting face 11a is the face where the light emitted by the light emitting element 20 is taken out, and has a recess 11e for installing the light emitting element 20.

The molded article 11 is preferably made of a material that is electrically insulating, is heat resistant, has suitable strength, and is opaque enough to transmit little of the emitted light from the light emitting element 20, external light, etc. Any thermoplastic resin known in the past can be used as this material, such as liquid crystal polymers, polyphthalamide resins, and polybutylene terephthalate. In particular, if a semi-crystalline polymer resin containing high-melting point crystals, such as a polyphthalamide resin, is used, the resulting package will have high surface energy, and will have good enough adhesion to light guide plates and so forth that can be attached later or sealing materials that can be provided inside an opening. Thermosetting resins that are known in this field, such as epoxy resins, modified epoxy resins, silicone resins, and modified silicone resins, can also be used. A white pigment such as titanium oxide or the like can also be mixed into the material of the molded article in order to reflect the light from the light emitting element more efficiently. The molded article 11 basically has a front portion 1 if and a rear portion 11r that intersect with one another at a line 11L, as indicated in FIGS. 1C and 1D.

Leads 12 and 13

With a package of a single light emitting device, there is at least one pair of (two) leads 12 and 13, part of which is embedded in the molded article 11. The leads 12 and 13 are partially deformed by bending, curving, or the like. The lead 12 is used to install a light emitting element and functions as one of the terminals, while the other lead 13 functions as the other terminal.

The leads 12 and 13 are exposed from the molded article 11 inside the recess 11e of the molded article 11, and the exposed faces thereof serve as an installation face for installing the light emitting element and a connection face with the light emitting element. The leads 12 and 13 extend from the installation face or connection face, and protrude from the rear face 11b of the molded article 11. The protruding leads 12 and 13 have ends 12a and 13a that curve to either the light emitting face 11a side or the rear face 11b side along the rear face 11b of the molded article 11. Also, the ends 12a and 13a preferably have distal ends 12b and 13b that curve along the side faces 11d of the molded article 11. Because the distal ends 12b and 13b are disposed on the side faces of the light emitting device, soldering to the mounting board is possible at the side faces and the bottom face of the light emitting device, and this increases the adhesive strength.

The ends 12a and 13a protruding from the bottom face 11c of the molded article 11 curve to the light emitting face 11a side.

Figure 1B:
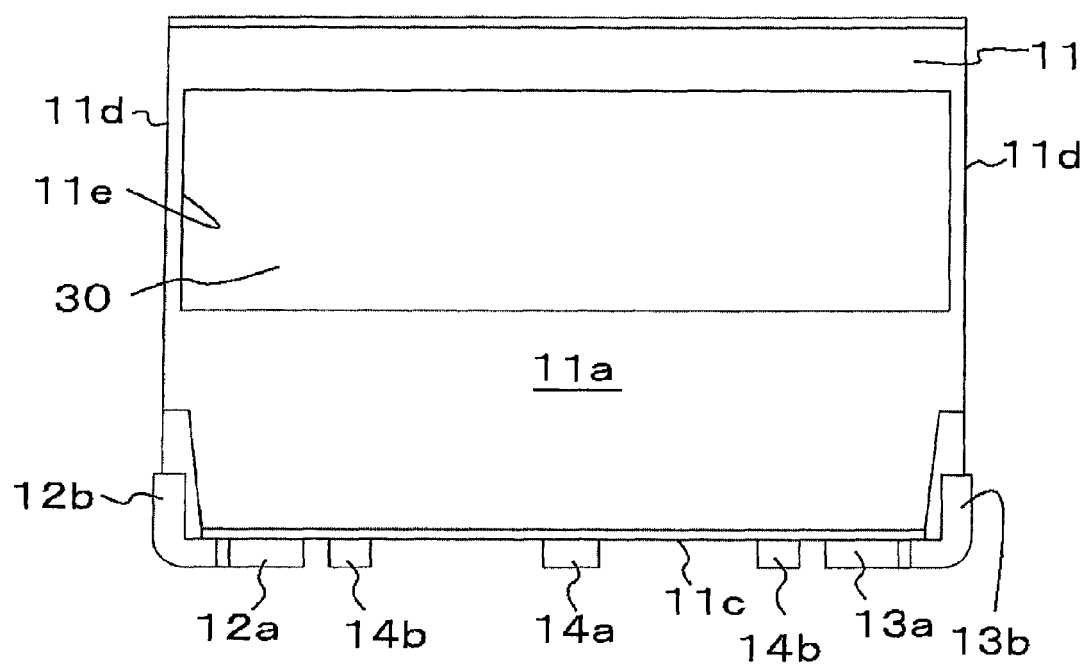
FIG. 1B is a top view (light emitting face) of the light emitting device in FIG. 1A.
Figure 1C:
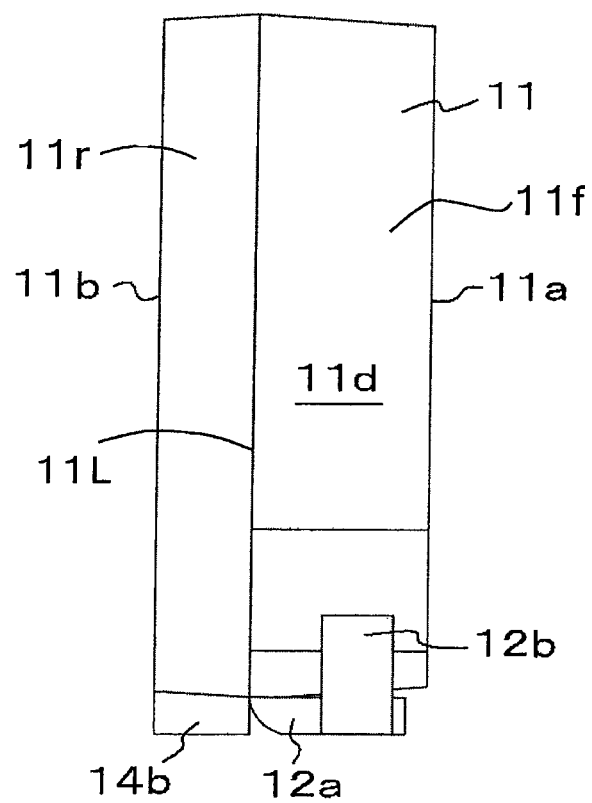
FIG. 1C is a side view of the light emitting device in FIG. 1A.
Figure 1D:
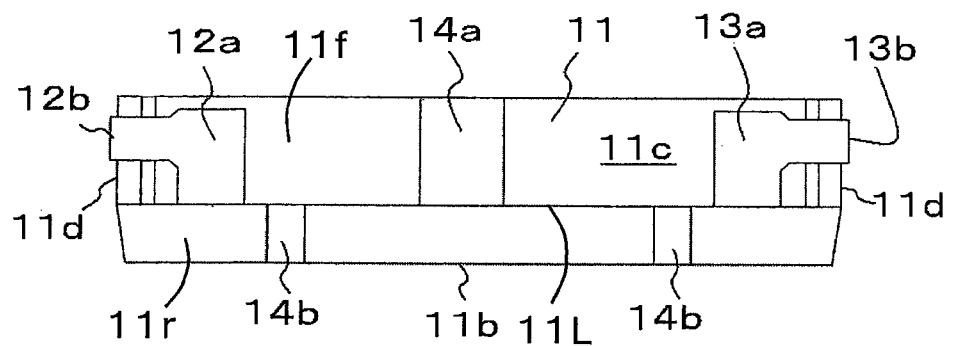
FIG. 1D is a bottom view of the light emitting device in FIG. 1A.
Figure 1E:
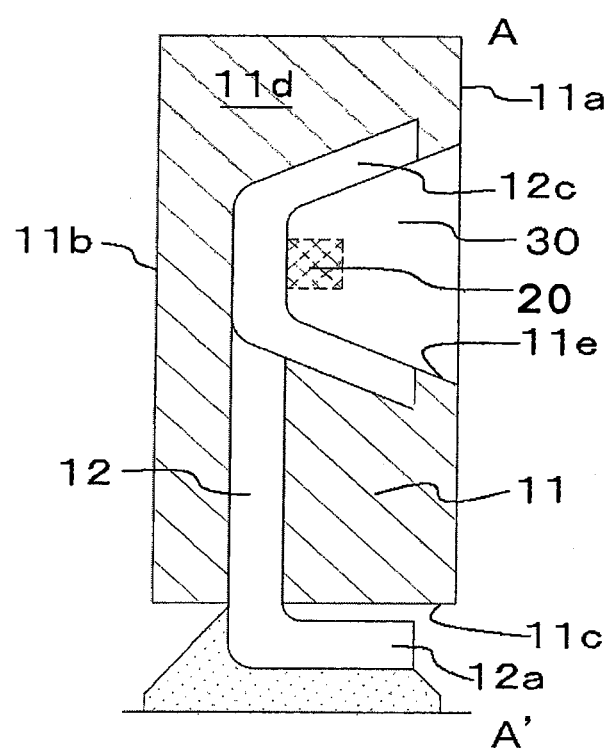
FIG. 1E is a cross section along the A-A' line of the light emitting device in FIG. 1A.

Also, of the pair of leads 12 and 13, as shown in FIG. 1E, the lead 12 on which the light emitting element is installed is preferably provided with wall components 12c bent so as to surround the installation face of the light emitting element. When the wall components 12c are exposed from the molded article 11, they can function as reflectors of the light emitted from the light emitting element, which prevents the photo-degradation of the molded article around the light emitting element and increases the light take-off efficiency.

It us usually preferable for the leads 12 and 13 to be made of a material with a relatively high thermal conductivity (such as at least about 200 W/(m·K)). This allows heat generated from the light emitting element to be transmitted more efficiently. Examples of such a material include nickel, gold, copper, silver, molybdenum, tungsten, aluminum, iron, and other such metals, and iron-nickel alloys, phosphor bronze, iron-containing copper, and other such alloys, all of which can be used in one or more layers.

Form of Package

When the light emitting device equipped with the above-mentioned leads 12 and 13 is mounted as a side-view type, the center of gravity of the light emitting device (and particularly the leads) may be shifted to the side on which the ends 12a and 13a of the leads 12 and 13 are bent, for example, and this tends to make toppling more the light emitting device likely to side on which the ends 12a and 13a are bent.

Therefore, to prevent an unstable state of the light emitting element caused by this imbalance in the center of gravity, etc., the molded article 11 comprises a front protruding part 14a that protrudes on the light emitting face 11a side and a rear protruding part 14b that protrudes on the rear face 11b side, between the leads 12 and 13 on the bottom face 11c. As shown in FIG. 1D, the front protruding part 14a extends along the bottom face 11c from the light emitting face 11a to the line 11L, ending at the line 11L, and therefore does not extend beyond the line 11L toward the rear face 11b. Further, an end surface of the front protruding part 14a is continuous with the light emitting face 11a, as is shown in FIGS. 1A and 1D. The rear protruding part 14b extends along the bottom face 11c from the rear face 11b to the line 11L, ending at the line L, and therefore does not extend beyond the line 11L toward the light emitting face 11a. Further, an end surface of the rear protruding part 14b is continuous with the rear face 11b, as shown in FIG. 1C. Also, as shown in FIG. 1D, there are two of the rear protruding parts 14b with the front protruding part 14a being between the two rear protruding parts 14b. However, the front protruding part 14a is offset from the rear protruding parts 14b and spaced apart therefrom defining a staggered pattern, with the front protruding part 14a being located on the front portion 11f of the molded article 11 and the rear protruding parts 14b being located on the rear portion 11r.

One or more of each of the front protruding part 14a and the rear protruding part 14b may be formed in a single molded article 11. If there are more than one of either of these, the front protruding part 14a and the rear protruding part 14b are preferably disposed in an alternating pattern in the width direction of the light emitting device (for example, the W direction in FIG. 1A).

If the front protruding part 14a and the rear protruding part 14b are disposed adjacent to (near) the above-mentioned lead ends 12a and 13a, then it is preferable if at least the adjacent front protruding part 14a and rear protruding part 14b are disposed on a different side from the side on which the lead ends are bent. That is, in FIG. 1A, since the lead end 12a is disposed on the light emitting face 11a side, it is preferable if the rear protruding part 14b that protrudes on the rear face side is disposed adjacent to the lead end 12a thereof.

As shown in FIGS. 1A and 1B, the front protruding part 14a and the rear protruding part 14b each need only be shifted to the light emitting face 11a side or the rear face 11b on the bottom face, and the end or edge of the molded article 11 does not necessarily have to coincide with the end or edge of the front protruding part 14a and rear protruding part 14b.

There are no particular restrictions on the length of the front protruding part 14a and the rear protruding part 14b in the depth direction of the molded article 11 (the arrow D direction in FIG. 1A) or their length in the width direction (the arrow W direction in FIG. 1A), and these lengths can be suitably adjusted as dictated by the size of the light emitting device. The lengths of the front protruding part 14a and the rear protruding part 14b in the D and W directions may be the same or different from each other. In particular, the length D of the front protruding part 14a and the rear protruding part 14b in the depth direction of the molded article 11 is preferably a length equivalent to the edge from the position where the leads 12 and 13 protrude from the bottom face 11c to the light emitting face 11a or the rear face 11b. The length W in the width direction is, for example, about ½₀ to ⅕ the width of the molded article 11, and preferably about ⅟₁₀ to ⅕.

There are no particular restrictions on the length H of the front protruding part 14a and the rear protruding part 14b in the height direction of the molded article 11 (the arrow H direction in FIG. 1A), as long as the height allows the mounting of the leads 12 and 13, but the height is preferably set so as to constitute substantially the same plane as that of the ends 12a and 13a of the bent leads 12 and 13 (that is, a plane corresponding to the bottom face at the ends 12a and 13a). The phrase "substantially the same plane" means that the height differential between the two falls within about ±10% of the height of the front protruding part 14a and the rear protruding part 14b.

Thus providing the front protruding part 14a and the rear protruding part 14b improves the mounting stability of the light emitting device. In particular, when these are disposed in an alternating pattern, they can be mounted more stably. Furthermore, mounting stability is even better when the height of the front protruding part 14a and the rear protruding part 14b constitutes the same plane as that of the ends 12a and 13a of the bent leads 12 and 13.

Also, because the front protruding part 14a and the rear protruding part 14b are present between the leads, there is no danger that the solder connecting the positive and negative leads 12 and 13 will spread out and join together.

Light Emitting Element 20

The light emitting element 20 is disposed on the bottom face of the recess of the molded article. Since the leads 12 and 13 are exposed at the bottom face as mentioned above, one electrode of the light emitting element 20 is electrically connected and installed on the surface of the lead 12, in particular. The other electrode of the light emitting element 20 is electrically connected to the other lead 13 disposed to form a pair with the lead 12. The light emitted from the light emitting element goes out through the light emitting face 11a to the outside of the package.

A light emitting diode having GaAlN, ZnS, SnSe, SiC, GaP, GaAlAs, AlN, InN, AlInGaP, InGaN, GaN, AlInGaN, or another such semiconductor as a light emitting layer on a substrate can be used to advantage as the light emitting element 20.

Sealing Resin 30

With the light emitting device of the present invention, the recess of the molded article 11 is usually filled with a sealing resin 30 to seal the light emitting element 20. The sealing resin 30 is preferably a resin that is translucent, examples of which include polyolefin resins, polycarbonate resins, polystyrene resins, epoxy resins, acrylic resins, acrylate resins, methacrylic resins (PMMA, etc.), urethane resins, polyimide resins, polynorbornene resins, fluororesins, silicone resins, modified silicone resins, and modified epoxy resins. This material may contain one of the known fluorescent substances discussed, for example, in WO 2006/038502, Japanese Laid-Open Patent Application 2006-229055 or elsewhere, pigments, fillers, dispersants, or the like.

Figure 2A:
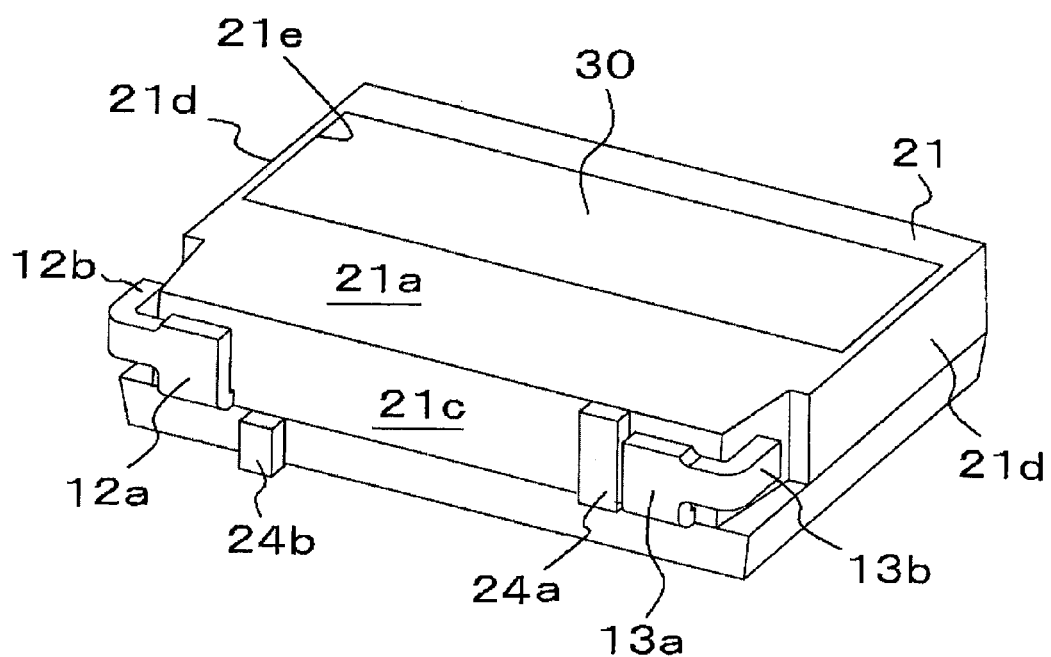
FIG. 2A is a top oblique view of the light emitting device in Embodiment 2 of the present invention.

To obtain the light emitting device in this embodiment, for example, a copper sheet (silver plated) is prepared in a specific thickness (about 0.1 to 1.0 mm, such as about 0.5 mm), and this is punched out in the desired shape. This forms a plurality of metal sheets whose shape of the desired units is contiguous in a specific direction, as shown in FIG. 2A.

After this, the metal sheets are molded with a resin material (the material of the molded article 11) by transfer molding or another such method. Recesses corresponding to the front protruding part and rear protruding part are provided to the upper and lower molds here. This forms a package array in which the leads 12 are embedded in resin material. In this package array, part of each individual lead 12 is exposed at the bottom part of the recess formed in the light emitting face 11a of the molded article 11, and the front protruding part 14a and the rear protruding part 14b are formed at positions corresponding to the bottom face of the molded article 11.

Next, the package array is cut into units by a dicing saw. This cuts out a plurality of light emitting devices from the package array.

It is generally preferable to ensure good moldability by giving the walls of the molds a shape that allows the molded article to be easily removed after molding (such as a tapered shape or a textured shape), and along with this, a tapered shape and/or a textured shape may be transferred to the surface shape of the molded article.

Embodiment 2

Figure 2B:
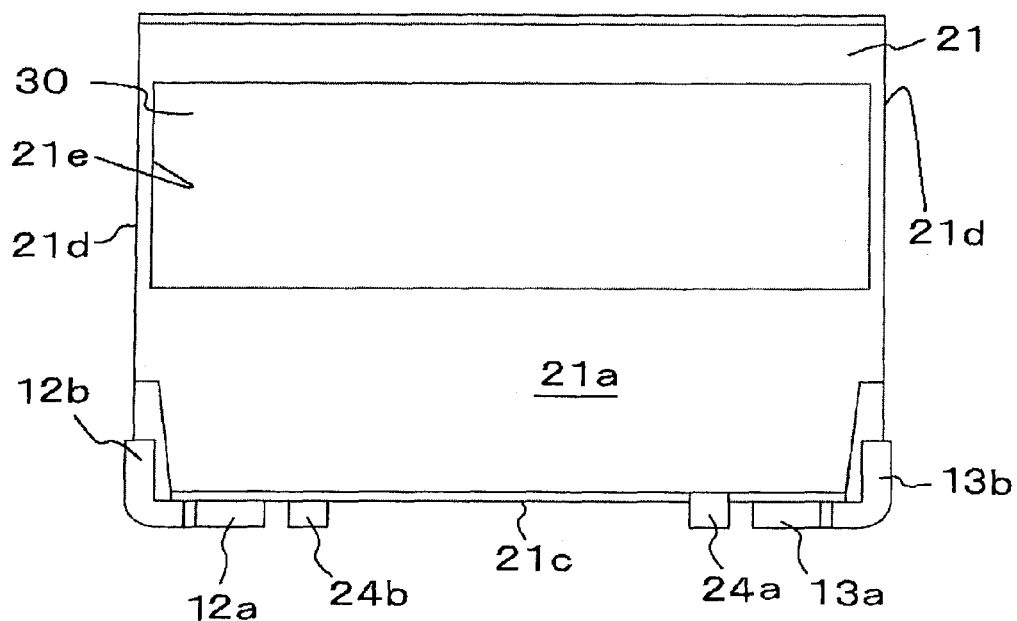
FIG. 2B is a top view (light emitting face) of the light emitting device in FIG. 2A.
Figure 2C:
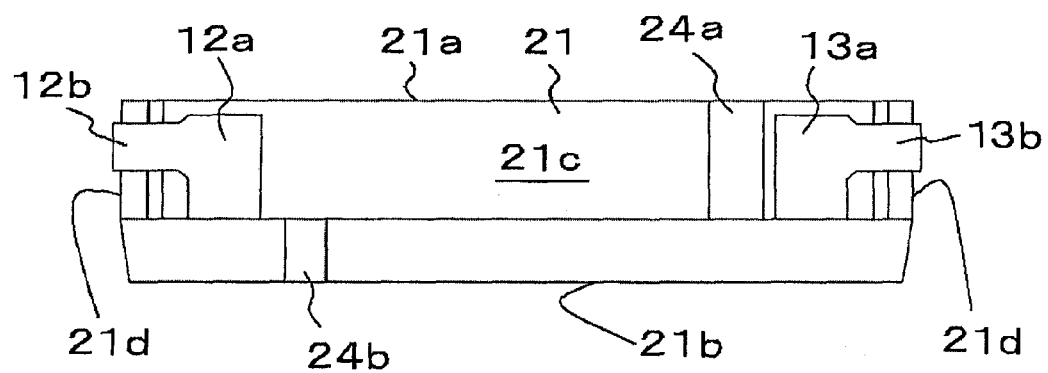
FIG. 2C is a bottom view of the light emitting device in FIG. 2A.

As shown in FIGS. 2A to 2C, the light emitting device in this embodiment is the same as the light emitting device in Embodiment 1 in that it comprises a light emitting element (not shown) and a package having a molded article 21 composed of resin and a pair of leads 12 and 13 that are partially embedded in this molded article 21.

The leads 12 and 13 protrude from the bottom face 21b of the molded article 21, and the protruding leads 12 and 13 have ends 12a and 13a that are bent to a light emitting face 21a side along the bottom face of the molded article 21. Also, ends 12a and 13a have distal ends 12b and 13b that are bent along side faces 21d of the molded article 21.

The molded article 21 comprises one each of a front protruding part 24a that protrudes on the light emitting face 21a side and a rear protruding part 24b that protrudes on the rear face 21b side, between the leads 12 and 13 on the bottom face 21c, and near each of the leads 12 and 13.

The light emitting device in this embodiment substantially has the same basic constitution as the light emitting device in Embodiment 1, except that the number of front protruding part 24a and rear protruding part 24b and their positions are different. Therefore, in Embodiment 2, just as in Embodiment 1, providing the front protruding part 24a and the rear protruding part 24b improves the mounting stability of the light emitting device. Also, there is no danger that the solder connecting the positive and negative leads 12 and 13 will spread out and join together.

Embodiment 3

Figure 3A:
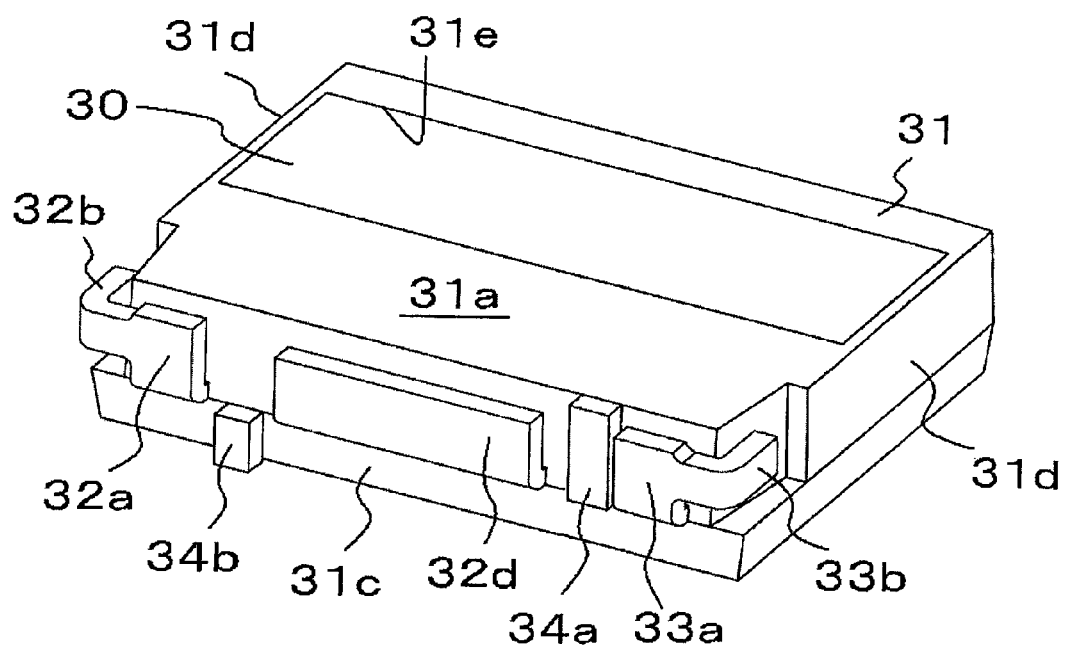
FIG. 3A is a top oblique view of the light emitting device in Embodiment 3 of the present invention.
Figure 3B:
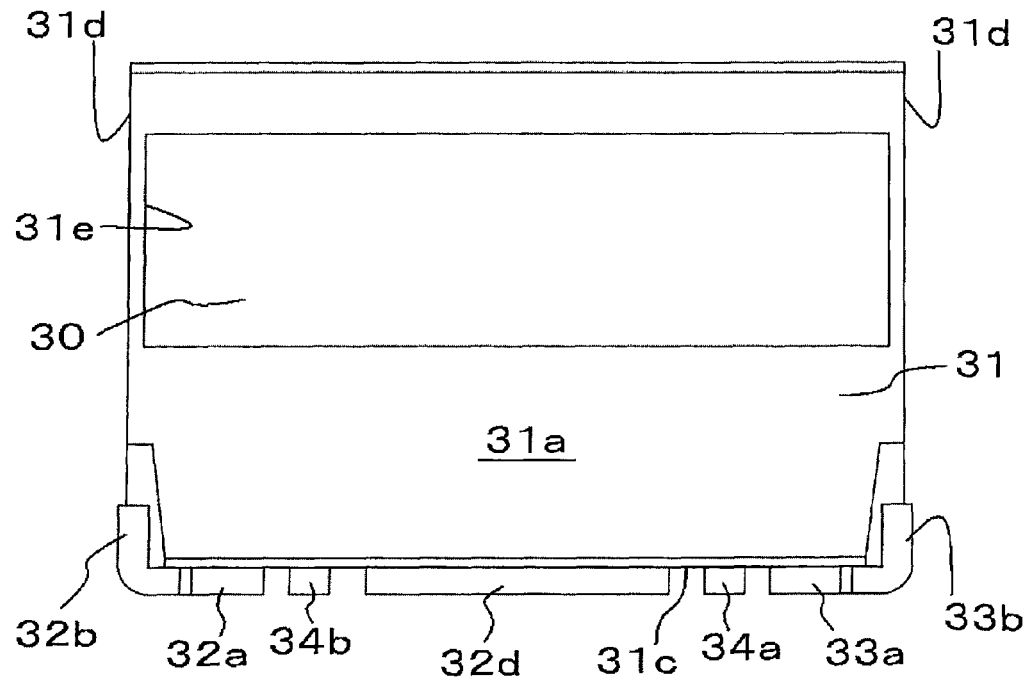
FIG. 3B is a top view (light emitting face) of the light emitting device in FIG. 3A.
Figure 3C:
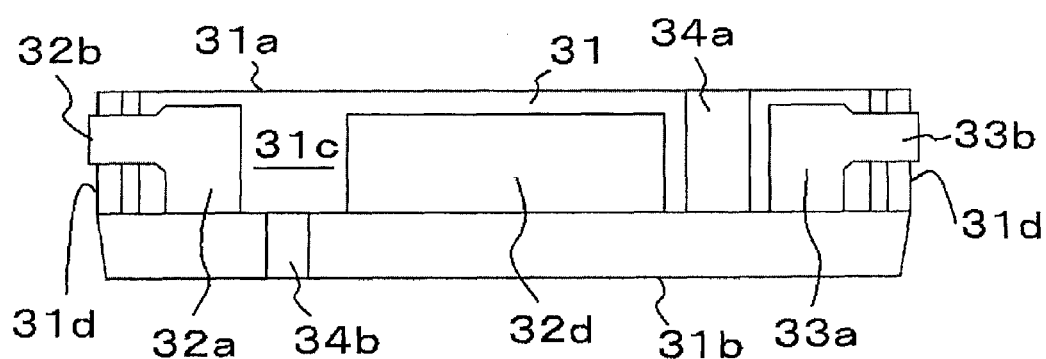
FIG. 3C is a bottom view of the light emitting device in FIG. 3A.

As shown in FIGS. 3A to 3C, the light emitting device in this embodiment is that same as the light emitting device in Embodiment 1 in that it comprises a light emitting element (not shown) and a package having a molded article 31 composed of resin and a pair of leads 32 and 33 that are partially embedded in this molded article 31.

The leads 32 and 33 protrude from the bottom face 31b of the molded article 31, and the protruding leads 32 and 33 have ends 32a and 33a that are bent to a light emitting face 31a side along the bottom face of the molded article 31. Also, ends 32a and 33a have distal ends 32b and 33b that are bent along side faces 31d of the molded article 31.

The lead 32 has an installation face for installing a light emitting element disposed inside the molded article 31, extends in one direction from this installation face, protrudes from the bottom face 31b of the molded article 31 to form the end 32a and the distal end 32b, and also extends in another direction of the installation face, such as from a location that is opposite in one direction, protrudes from between the leads 32 and 33 on the bottom face 31b of the molded article 31, and constitutes a third lead end 32d.

The third lead end 32d is preferably bent in the same direction as the direction in which the ends 32a and 32b of the pair of leads 32 and 33 are bent.

The fact that the third lead end 32d protrudes from inside the molded article 31 in a state of branching off from the lead where the light emitting element is disposed (out of the pair of leads 32 and 33) inside the molded article 31 as discussed above is an advantage in that it ensures a path for heat to be transmitted to the outside, but the third lead end 32d may be disposed separately from the leads 32 and 33 and protrude from inside the molded article 31. Also, the fact that the third lead end 32d has a relatively large surface area inside and outside the molded article 31 is an advantage in that heat transmission is improved, so this surface area is preferably made as large as possible to the extent that this does not lead to an increase in the size of the light emitting device. To this end, for example, it is preferably formed wider inside the molded article 31 and at least near the bottom face 31c, and protrudes from the bottom face 31c with this increased width maintained. The length of the third lead end 32d in the width direction in this case (see the arrow W in FIG. 1A) may be about 1/10 to 1/1.5 the width of the molded article 31, and preferably about 1/5 to 1/2.

In this embodiment, the molded article 31 comprises one each of the front protruding part 34a that protrudes on the light emitting face 31a side and the rear protruding part 34b that protrudes on the rear face 31b side, near the leads 32 and 33, between the leads 32 and 33 on the bottom face 31c, and between the end 33a and the third lead end 32d, in substantially the same manner as in Embodiment 2.

The light emitting device in this embodiment substantially has the same basic constitution as the light emitting device in Embodiment 2, except that it further comprises the above-mentioned third lead end 32d. Therefore, in Embodiment 3, just as in Embodiments 1 and 2, providing the front protruding part 34a and the rear protruding part 34b improves the mounting stability of the light emitting device. Also, there is no danger that the solder connecting the positive and negative leads 12 and 13 will spread out and join together.

Embodiment 4

Figure 4A:
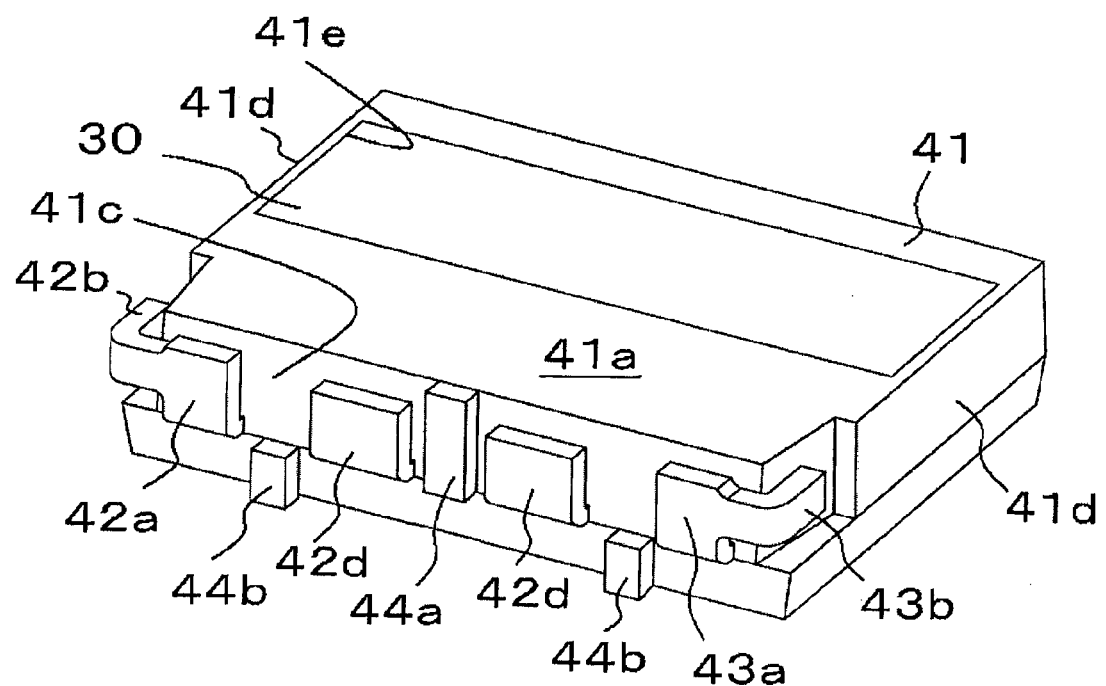
FIG. 4A is a top oblique view of the light emitting device in Embodiment 4 of the present invention.
Figure 4B:
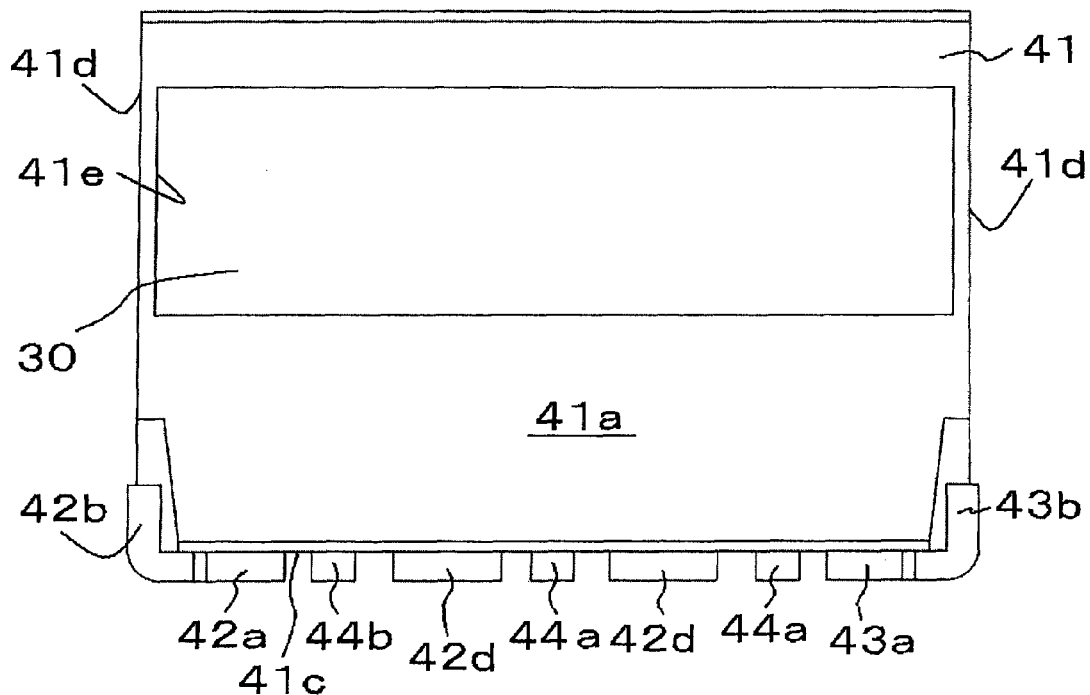
FIG. 4B is a top view (light emitting face) of the light emitting device in FIG. 4A.
Figure 4C:
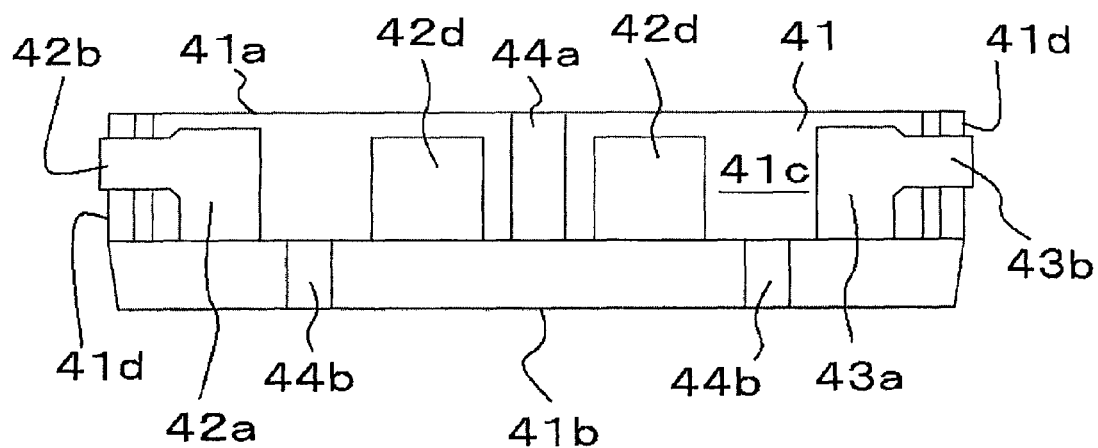
FIG. 4C is a bottom view of the light emitting device in FIG. 4A.

As shown in FIGS. 4A to 4C, the light emitting device in this embodiment is the same as the light emitting device in Embodiment 1 in that it comprises a light emitting element (not shown) and a package having a molded article 41 composed of resin and a pair of leads 42 and 43 that are partially embedded in this molded article 41.

The leads 42 and 43 protrude from the bottom face 41b of the molded article 41, and the protruding leads 42 and 43 have ends 42a and 43a that are bent to a light emitting face 41a side along the bottom face of the molded article 41. Also, ends 42a and 43a have distal ends 42b and 43b that are bent along side faces 41d of the molded article 41.

The lead 42 has an installation face for installing a light emitting element disposed inside the molded article 41, extends in one direction from this installation face, protrudes from the bottom face 41b of the molded article 41 to form the end 42a and the distal end 42b, and also extends in another direction of the installation face, such as from a location that is opposite in one direction, protrudes from between the leads 42 and 43 on the bottom face 41b of the molded article 41, and constitutes a third lead end 42d. The third lead end 42d here branches inside the molded article 41, branching in two at the bottom face 41c and protruding from the molded article 41.

The length of the third lead end 42d in the width direction (see the arrow W in FIG. 1A) may be about 1/20 to 1/3 the width of the molded article 41, and preferably about 1/10 to 1/4.

The third lead end 42d is preferably bent in the same direction as the direction in which the ends 42a and 42b of the pair of leads 42 and 43 are bent.

This third lead end 42d may also branch off from the lead where the light emitting element is disposed inside the molded article 41, and may be separate from the pair of leads 42 and 43.

In this embodiment, the molded article 41 comprises one each of the front protruding part 44a that protrudes on the light emitting face 41a side and the rear protruding part 44b that protrudes on the rear face 41b side, between the leads 42 and 43 on the bottom face 41c, between the end 43a and one of the third lead ends 42d, between the end 42a and the other third lead end 42d, and between the two third lead ends 42d, in substantially the same manner as in Embodiment 1.

The light emitting device in this embodiment substantially has the same basic constitution as the light emitting device in Embodiments 1 and 3, except for further comprising the above-mentioned third lead end 42d. Therefore, in Embodiment 4, just as in Embodiments 1 and 3, providing the front protruding part 44a and the rear protruding part 44b improves the mounting stability of the light emitting device. Also, there is no danger that the solder connecting the positive and negative leads 42 and 43 will spread out and join together.

Embodiment 5

Figure 5:
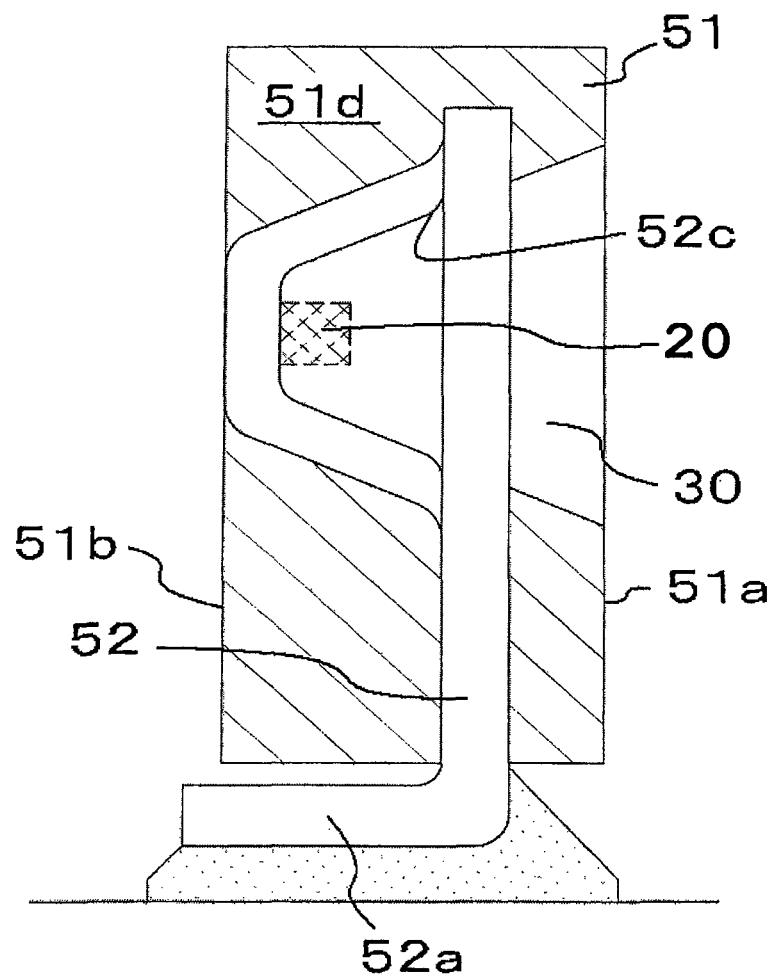
FIG. 5 is a simplified cross section of the light emitting device in Embodiment 5 of the present invention.

As shown in FIG. 5, the light emitting device in this embodiment is a side-view light emitting device that mainly comprises a package and a light emitting element 20.

A molded article 51 constituting part of the package is itself substantially the same as in Embodiment 1, etc.

Of the pair of leads constituting part of the package, a lead 52 where the light emitting element is installed is such that the portion around the light emitting element installation face is worked into a recessed shape, the bottom of the recess corresponds to the installation face, and walls 52c are disposed so as to surround this area. The walls 52c, just as in Embodiment 1, prevent photodegradation around the light emitting element and increase the light takeoff efficiency.

This lead 52 extends from the installation face and protrudes from the bottom face 51b of the molded article 51. The protruding lead 52 has an end 52a that is bent to the rear face 51b side along the bottom face 51c of the molded article 51.

Also, the end 52a preferably has a distal end 52b that is bent along the side face 51d of the molded article 51.

The other lead 53 extends from the connection face, protrudes from the bottom face 51b of the molded article 51 just as the lead 52 does, and has an end 53a and a distal end 53b that are bent to the rear face 51b side.

This molded article 51 comprises a front protruding part (not shown) that protrudes on the light emitting face 51a side, and a rear protruding part (not shown) that protrudes on the rear face 51b side, between the leads 52 and 53 of the bottom face 51c.

Two of the front protruding parts are disposed near the lead ends 52a and 53a, and one rear protruding part is disposed near the center between these front protruding parts. That is, the front protruding parts and the rear protruding part are each disposed on a different side from the side on which at least the adjacent lead end is bent.

The light emitting device in this embodiment is substantially the same as the basic constitution of the light emitting device in Embodiment 1, except that the form of the light emitting device installation face of the lead 52 and the direction in which the lead end is bent are different, and along with this the positions of the front protruding parts and the rear protruding part have shifted. Therefore, in Embodiment 5, just as in Embodiment 1, providing the front protruding parts and the rear protruding part increases the mounting stability of the light emitting device. Also, there is no danger that the solder connecting the positive and negative leads will spread out and join together.

What is claimed is:

1. A side-view type light emitting device comprising:
   a light emitting element,
   a pair of leads that is connected to the light emitting element;
   a molded article formed in a substantially cuboid shape, embedding a part of the pair of leads, and including a width direction, a depth direction, a depth in the depth direction, a front portion, a rear portion, and a plurality of protruding parts;
   the protruding parts including at least one front protrusion and at least one rear protrusion;
   the front portion including a front face, a recess, a bottom, and the at least one front protrusion, the recess in a substantially rectangular shape in a planar view on the front face, the at least one front protrusion protruding from the bottom of the front portion and including a first length in the depth direction of the molded article;
   the rear portion including a bottom and the at least one rear protrusion, the at least one rear protrusion protruding from the bottom of the rear portion and including a second length in the depth direction of the molded article;
   the protruding parts disposed offset in the width direction from one another, the sum of the first length and the second length are equal to the depth of the molded article, and at least one of the pair of leads is disposed between the protruding parts.

2. The side-view type light emitting device of claim 1, wherein
   among the at least two protruding parts, an end face of at least one of the protruding parts is disposed on the same plane as end faces of the pair of leads.

3. The side-view type light emitting device of claim 1, wherein
   an end face of one of the protruding parts is disposed on the same plane as an end face of another of the protruding parts.

4. The side-view type light emitting device of claim 1, wherein
   the pair of leads protrude from the bottom face of the molding article,
   at least one of the pair of leads protruding from the bottom face is disposed between the protruding parts.

5. The side-view type light emitting device of claim 1, wherein
   at least one of the protruding parts is disposed between the pair of leads.

6. The side-view type light emitting device of claim 1, wherein
   end faces of the pair of leads are disposed on the same plane.

7. The side-view type light emitting device of claim 1, wherein
   one of the protruding parts protrudes from a substantially cuboid outline of the molded article.

8. The side-view type light emitting device of claim 1, wherein
   a height of the protruding parts from the bottom face of the molded article is equal to or larger than height of the pair of leads from the bottom face of the molded article.

9. A molding product comprising:
   a pair of leads;
   a molded article formed in a substantially cuboid shape, having a window in a substantially rectangular shape, embedding a part of the pair of leads, and including a width direction, a depth direction, a depth in the depth direction, a front portion, a rear portion, and a plurality of protruding parts;
   the protruding parts including at least one front protrusion and at least one rear protrusion;
   the front portion including a bottom and the at least one front protrusion, the at least one front protrusion protruding from the bottom of the front portion and including a first length in the depth direction of the molded article;
   the rear portion including a bottom and the at least one rear protrusion, the at least one rear protrusion protruding from the bottom of the rear portion and including a second length in the depth direction of the molded article;
   the protruding parts disposed offset in the width direction from one another, the sum of the first length and the second length are equal to the depth of the molded article, and at least one of the pair of leads is disposed between the two protruding parts.

10. A side-view type light emitting device comprising:
    a light emitting element,
    a pair of leads that is connected to the light emitting element;

a molded article embedding a part of the pair of leads, and including a depth direction, a width direction, a front portion, a rear portion, and a plurality of protruding parts;

the protruding parts including at least one front protrusion and at least one rear protrusion;

the front portion including a bottom and the at least one front protrusion, the at least one front protrusion protruding from the bottom of the front portion and including a first length in the depth direction of the molded article;

the rear portion including a bottom and the at least one rear protrusion, the at least one rear protrusion protruding from the bottom of the rear portion and including a second length in the depth direction of the molded article;

the protruding parts disposed offset in the width direction from one another, and an end face of the at least one rear protrusion is disposed on the same plane as an end face of the at least one front protrusion.

11. The side-view type light emitting device of claim 10, wherein at least one of the pair of leads is disposed on the same plane as an end face of the rear face of the front protruding part.

12. The side-view type light emitting device of claim 10, wherein a pair of the leads are exposed from the molded article and extend toward a front face, a length of one of the pair of leads which is exposed from the molded article and extends toward a front face is shorter than length from a rear face to a front face of the at least one front protrusion.

13. The side-view type light emitting device of claim 10, wherein the first length is greater than the second length.

* * * * *